United States Patent
Hwee-Seng Jimmy et al.

(10) Patent No.: US 7,795,071 B2
(45) Date of Patent: Sep. 14, 2010

(54) SEMICONDUCTOR PACKAGE FOR FINE PITCH MINIATURIZATION AND MANUFACTURING METHOD THEREOF

(75) Inventors: Chew Hwee-Seng Jimmy, Singapore (SG); Ong Chee Kian, Singapore (SG); Abd. Razak Bin Chichik, Singapore (SG)

(73) Assignee: Advanpack Solutions Pte Ltd., Singapore (SG)

( * ) Notice: Subject to any disclaimer, the term of this patent is extended or adjusted under 35 U.S.C. 154(b) by 0 days.

(21) Appl. No.: 11/898,717

(22) Filed: Sep. 14, 2007

(65) Prior Publication Data
US 2008/0145967 A1    Jun. 19, 2008

Related U.S. Application Data

(63) Continuation-in-part of application No. 11/882,194, filed on Jul. 31, 2007, now abandoned.

(30) Foreign Application Priority Data
Dec. 14, 2006    (TW) ................ 95146945 A (51) Int. Cl.
*H01L 21/00*    (2006.01)
(52) U.S. Cl. .......... 438/106; 257/666; 257/667; 257/673; 257/708; 257/710; 257/E23.01; 257/E23.023; 257/E23.031; 257/E23.034; 257/E23.036; 438/111; 438/112
(58) Field of Classification Search ............. 438/106, 438/111, 112; 257/666, 673, 676, 667, 668, 257/688, 690–691, 708, 710, 678, E23.01, 257/E23.023, E23.031, E23.034, E23.036, 257/E23.065, E23.06, E23.062, E23.07; 174/261–262; 361/820, 767, 777, 783, 770, 762, 679, 748
See application file for complete search history.

(56) References Cited

U.S. PATENT DOCUMENTS

| | | | |
|---|---|---|---|
| 5,481,798 A * | 1/1996 | Ohsawa et al. ............... 29/827 |
| 5,608,265 A | 3/1997 | Kitano et al. |
| 5,877,559 A | 3/1999 | Takayama et al. |
| 6,528,869 B1 | 3/2003 | Glenn et al. |
| 6,563,202 B1 * | 5/2003 | Ohsawa et al. ............ 257/673 |
| 6,784,376 B1 | 8/2004 | Huemoeller et al. |
| 2001/0017221 A1 * | 8/2001 | Horiuchi et al. ............ 174/260 |
| 2003/0045024 A1 * | 3/2003 | Shimoto et al. ............ 438/106 |
| 2003/0194855 A1 | 10/2003 | Park et al. |
| 2005/0088833 A1 | 4/2005 | Kikuchi et al. |

* cited by examiner

*Primary Examiner*—A. Sefer
*Assistant Examiner*—Ermias Woldegeorgis
(74) *Attorney, Agent, or Firm*—Rabin & Berdo, PC (57) ABSTRACT

A semiconductor package and a manufacturing method thereof are provided. The package element has a first insulating layer, and a plurality of holes are disposed on the first surface of the first insulating layer. Besides, a plurality of package traces are embedded in the insulating layer and connected to the other end of the holes. The holes function as a positioning setting for connecting the solder balls to the package traces, such that the signal of the semiconductor chip is connected to the package trace via conductor of the chip, and further transmitted externally via solder ball. The elastic modulus of the material of the first insulating layer is preferably larger than 1.0 GPa.

4 Claims, 11 Drawing Sheets

SEMICONDUCTOR PACKAGE FOR FINE PITCH MINIATURIZATION AND MANUFACTURING METHOD THEREOF

This is a continuation-in-part application of application Ser. No. 11/882,194, filed on Jul. 31, 2007.

BACKGROUND OF THE INVENTION

1. Field of the Invention

The invention relates in general to a semiconductor package and manufacturing method thereof, and more particularly to a semiconductor package whose lead frame can be independently isolated and transported during the manufacturing process.

2. Description of the Related Art

Along with the advance in science and technology, the demand for various electronic products is booming. Meanwhile, as miniaturization is expected of electronic products by consumers, the semiconductor element, a crucial element used in an electronic product, is also directed towards the design of miniaturization, and the reduction in the pitch and width of the circuit of a semiconductor element has always been an important direction in the semiconductor industry. However, in addition to the reduction in the pitch and width of the circuit inside a semiconductor chip, the chip package carrying the signal and extended to the external also plays an important part in the miniaturization of a semiconductor element. If the circuit and pitch of a semiconductor package can not be effectively reduced, the miniaturization in the size of a semiconductor element using the same will be very limited.

For example, the thickness of a metallic trace of a conventional package normally ranges between 120~250 micrometer, and a package trace is formed after the process of microfilming, exposure and etching. However, the etching process restricts the pitch and width of a circuit, and the undercutting effect will affect the reliability of the package trace. Therefore, the conventional lead frame of the package trace is not suitable to the miniaturization in semiconductor element.

Thus, how to resolve the above problem of element miniaturization and simplify the manufacturing process of the package has become an important direction in the research and development of semiconductor package.

SUMMARY OF THE INVENTION

According to a first aspect of an embodiment of the present invention, a semiconductor package is provided. The semiconductor package comprises a first insulating layer and a plurality of package traces, wherein a plurality of holes are disposed on a first surface of the first insulating layer, and the package traces are embedded in the insulating layer and connected to another end of the holes.

According to an aspect of another embodiment of the present invention, a semiconductor package is provided. The semiconductor package comprises a first insulating layer, a plurality of positioning units and a plurality of package traces. The elastic modulus of the first insulating layer is larger than 1.0 GPa. The positioning units are disposed on the first insulating layer. The package traces are disposed under the positioning unit.

According to an aspect of another embodiment of the present invention, a manufacturing method of a semiconductor package is provided. The manufacturing method comprises the following steps. Firstly, a carrier is provided. Next, a plurality of traces are formed on the carrier. Then, a first insulating layer is formed on the traces. Afterwards, a plurality of positioning units are formed on a first surface of the first insulating layer next, wherein the positioning unit contacts the trace directly.

According to an aspect of another embodiment of the present invention, a method of manufacturing a semiconductor package is provided. The method of manufacturing the semiconductor package comprises the following steps. Firstly, a carrier is provided. Then, a plurality of electrically isolated package trace layout units are formed by a first conductive layer, wherein the package trace layout unit is formed by a plurality of electrically isolated package traces. Afterwards, a patterned second conductive layer is formed on the first conductive layer. Then a first insulating layer is formed by a molding material and embedded in the first conductive layer and the second conductive layer. After that, part of the carrier is selectively removed.

The invention will become apparent from the following detailed description of the preferred but non-limiting embodiments. The following description is made with reference to the accompanying drawings.

DETAILED DESCRIPTION OF THE INVENTION

First Embodiment

Figure 1:
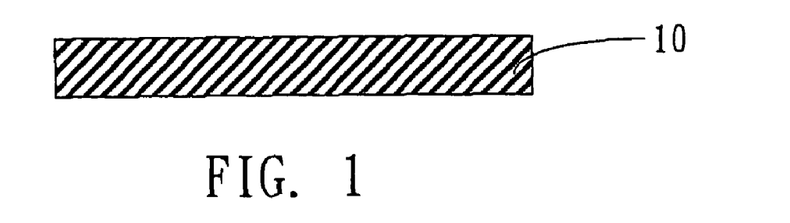
FIG. 1 to FIG. 8 are process flowcharts of manufacturing an independent semiconductor package according to a first embodiment of the invention.
Figure 2:
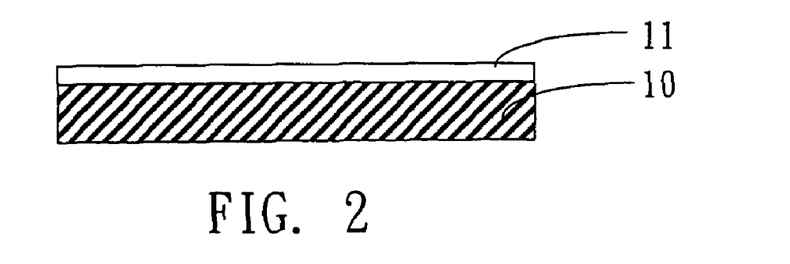
Figure 3:
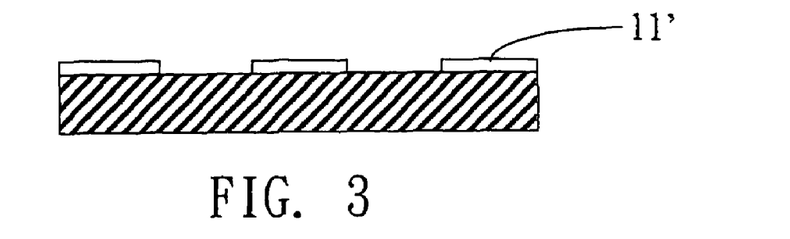

Referring to FIG. 1 onwards, process flowcharts of manufacturing an independent semiconductor package according to a first embodiment of the invention are shown. Firstly, a carrier 10 is provided. In the present embodiment of the invention, the carrier 10 is a steel piece. Then, referring to FIG. 2, a photo-resist layer 11 is formed on the carrier 10 first, and further shaped as a patterned photo-resist layer 11' as indicated in FIG. 3.

Figure 4:
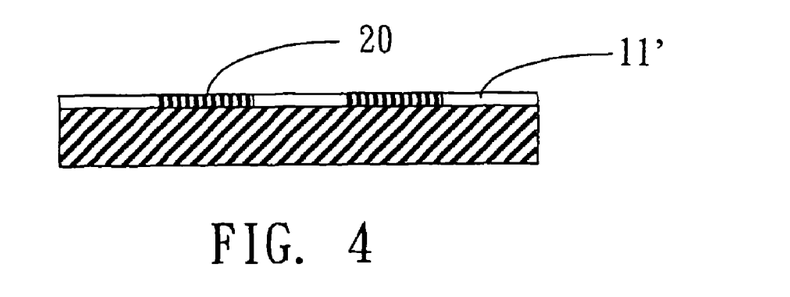
Figure 5:
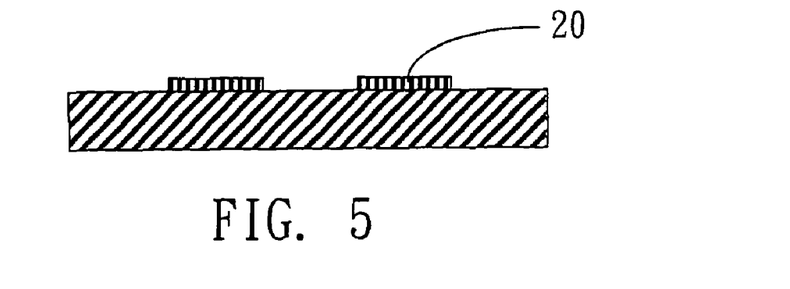

Referring to FIG. 4, a conductive layer 20 is formed in the empty part of the photo-resist layer 11', wherein the thickness of the conductive layer 20 normally between ranges 0.01~0.4 mm, but preferably ranges between 0.025~0.035 mm. In the present embodiment of the invention, the conductive layer 20 is formed by electroplating. As indicated in FIG. 5, the photo-resist layer 11' is removed, but the conductive layer 20 (the first conductive layer) is left and used as package traces not the traces inside a semiconductor chip. In the present embodiment of the invention, a plurality of package traces formed by the conductive layer 20 are preferably electrically isolated and used as a package trace layout unit. In practical application, the package traces are electrically connected to each other. During the process of formation, a plurality of package trace layout units are formed, and each package trace layout unit substantially has the same pattern and individually corresponds to a to-be-packaged chip.

Figure 6:
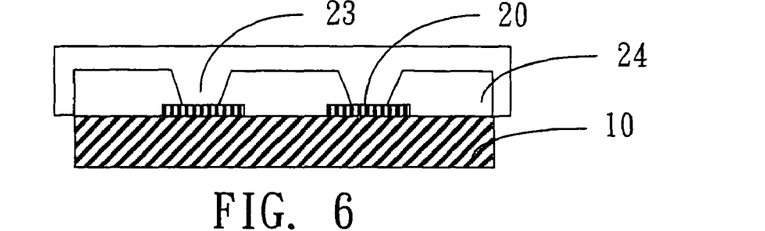
Figure 7:
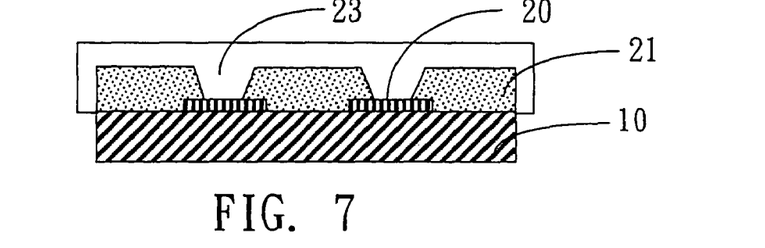

Referring to FIG. 6, a mold 23 is provided, wherein the mold 23 has a plurality of protrusions corresponding to the position of the trace layer 20. A plurality of mold cavities 24 are formed in the mold 23. Then, an insulating material is infused in the mold cavities 24 to form a first insulating layer 21, wherein the thickness of the first insulating layer 21 normally ranges between 0.1~0.4 mm, but preferably ranges between 0.18~0.22 mm. As indicated in FIG. 7, a plurality of package traces are embedded in the first insulating layer 21 or disposed in the first insulating layer 21 and extended to a surface of the first insulating layer 21. In the present embodiment of the invention, the insulating material is a molding material, the elastic modulus of the insulating material is larger than 1.0 GPa, and preferably the CTE value of the insulating material is less than 10 ppm. In practical application, the first insulating layer 21 is not necessarily limited to one layer. Any one who is skilled in the technology of the invention can use several materials to compose a compound insulating layer in several times of formation or use the same material to compose an insulating layer in several times of formation, and such modifications are still within the scope of protection of the invention. However, in the present embodiment of the invention, the first insulating layer 21 is formed from a single material, such that the package traces are embedded in the first insulating layer 21. That is, the height of the first insulating layer 21 must be larger than the height of the package traces.

Figure 8:
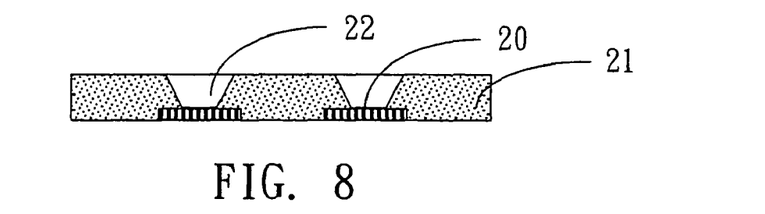

As a plurality of protrusions disposed on the mold 23 correspond to the trace layer 20, a plurality of holes 22 are formed on a surface of the first insulating layer 21. Referring to FIG. 8, the mold 23 and the carrier 10 are removed, and a semiconductor package that can be transported independently is formed. In the present embodiment of the invention, the other end of the holes 22 contacts the package trace of the trace layer 20, wherein the holes used as positioning units for connecting the conductors are made from the trace layer 20

Figure 9:
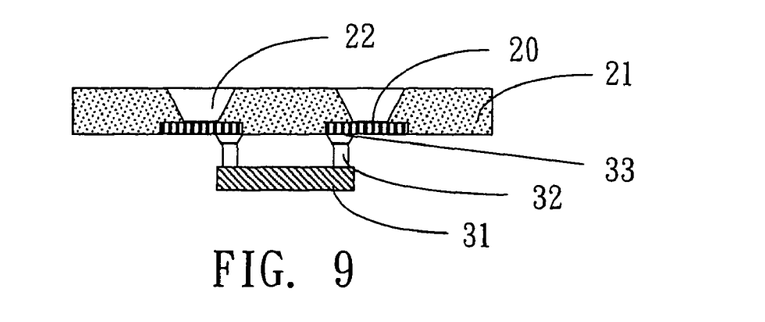
FIG. 9 to FIG. 14 are detailed flowcharts of manufacturing and connecting an independent semiconductor package to a chip exemplified by three different chip packages according to a first embodiment of the invention.
Figure 10:
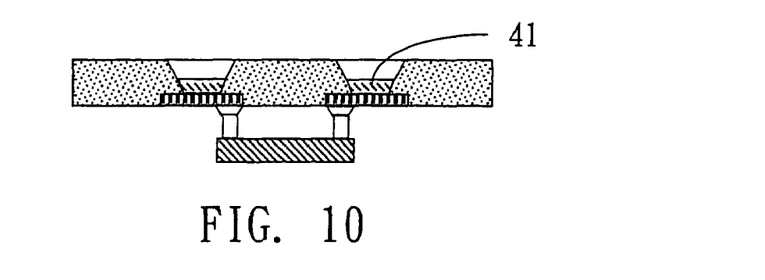

Referring to FIG. 9, an independent semiconductor package manufactured according to FIG. 8 is connected to a chip 31 via a second conductor. In the present embodiment of the invention, the second conductor is connected to the chip 31 via a solder 33 and a pillar bump 32. Besides, as indicated in FIG. 10, the hole 22 can be fully or partly filled with a conductive material, such as nickel, gold, copper or solder, to form a second conductive layer 41. In the present embodiment of the invention, the conductive material is formed by solder 41 to facilitate subsequent processing.

Figure 11:
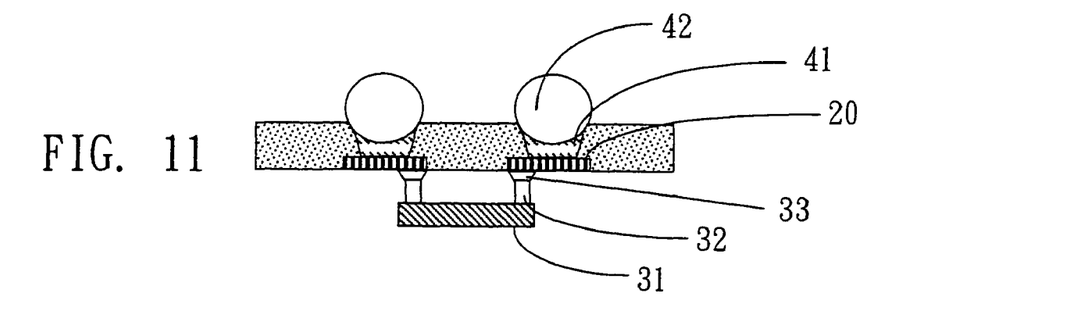

Referring to FIG. 11, the conductor 42 is fixed on the independent semiconductor package via position-setting of the holes 22, such that the signal of the chip 31 is transmitted externally via pillar bump 32, the solder 33, the trace layer 20, and the conductor 42. In the present embodiment of the invention, the conductor 42 is a solder ball or a trace and the conductor 42 could be used to connect to printed circuit board (PC Board) or another layer of receiving substrate. To avoid the solder of the solder ball flowing everywhere when melted, the positioning unit limits is for confining the solder to be within the hole 22. In the present embodiment of the invention, the positioning unit is a hole 22, which can be a run through hole or an indent only.

The solder 41 enables the electrically connection between the conductor 42 and the trace layer 20 even more tightly, and avoids the occurrence of bubbles which occurs when a solder ball is used as the conductor 42 but can not completely fill up the hole 22.

Figure 12:
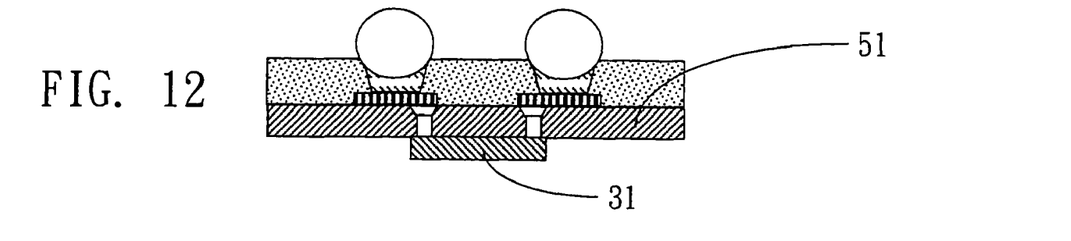
Figure 13:
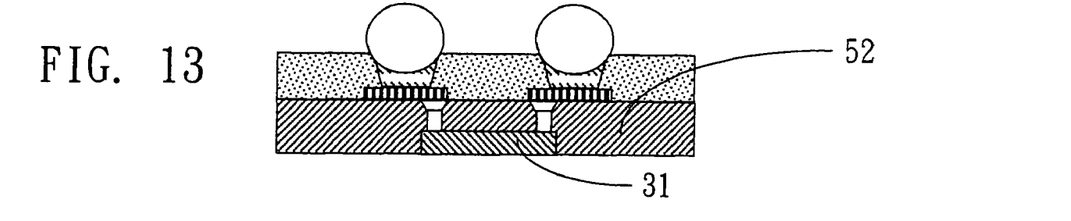
Figure 14:
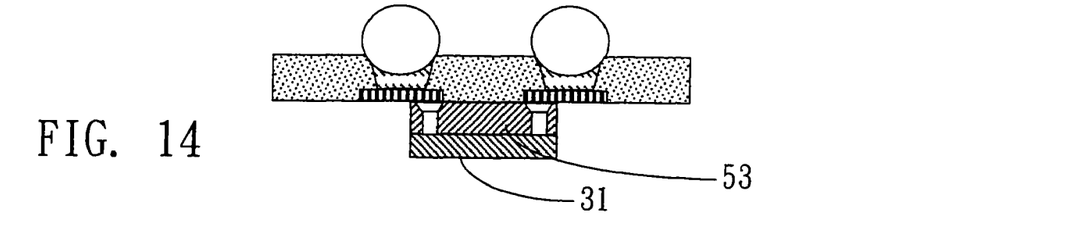

On the other hand, the independent semiconductor package and the package of the chip 31 can be flexible. Referring to FIG. 12, an insulating material, such as an encapsulating material, can be used as a second insulating layer 51 and infused to the chip 31 to encapsulate the pillar bump 32 but exposes the chip 31. Or, as indicated in FIG. 13, the second insulating layer 52 encapsulates the pillar bump 32 and the chip 31 but exposes the upper surface of the chip 31. Or, as indicated in FIG. 14, the second insulating layer 53 encapsulates the pillar bump 32 but is aligned with the chip 31.

Figure 15:
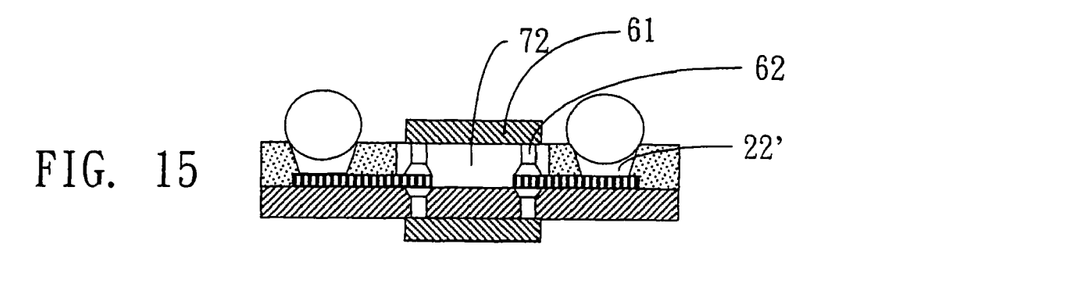
FIG. 15 is an example of the first embodiment of the invention used in a multi-chip package.

Besides, the semiconductor package is also used in a multi-chip package. Referring to FIG. 15, a space 72 permitting the chip 61 to be fixed and connected to the trace is disposed in addition to the hole of the first insulating layer, and the chip is connected to the solder ball via a hole 22'.

Figure 16:
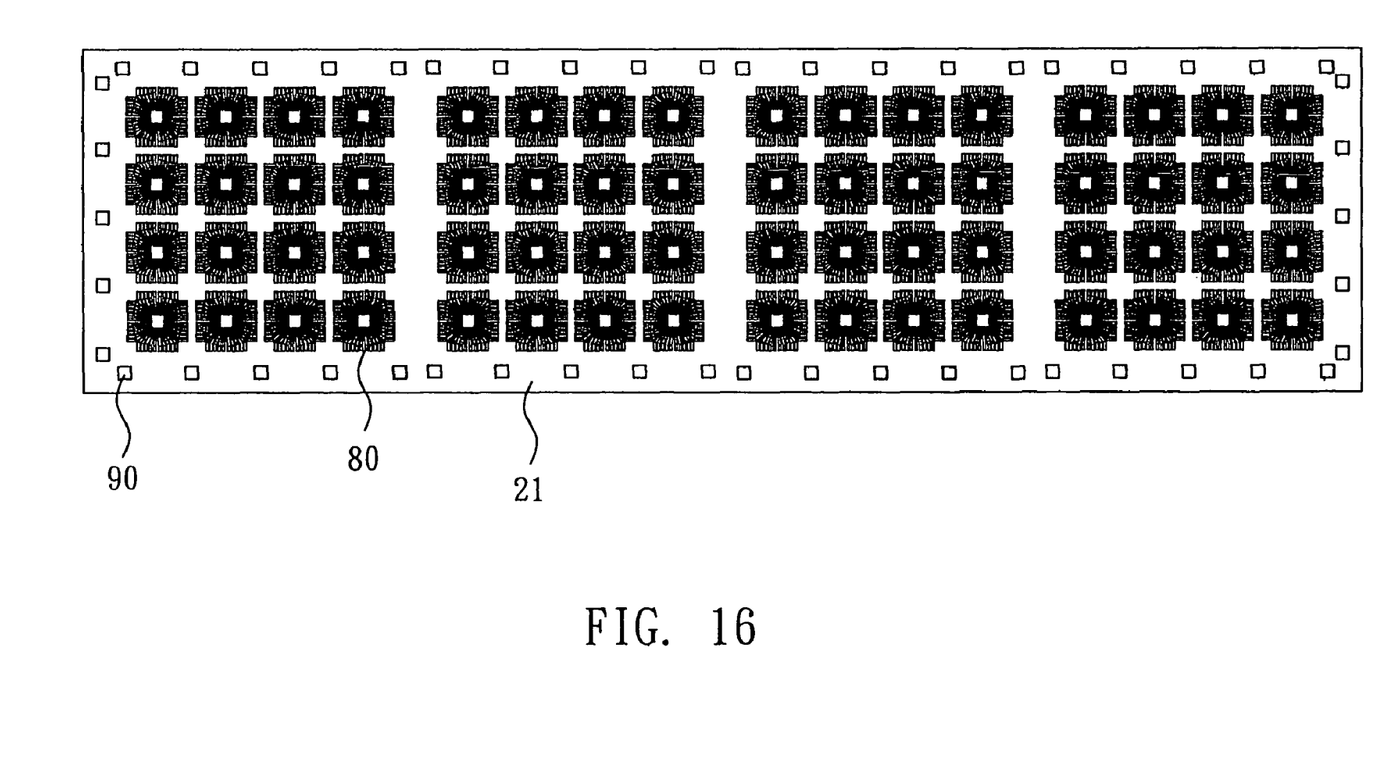
FIG. 16 to FIG. 17 are detailed diagrams before the package elements of the first embodiment of the invention are packaged.
Figure 17:
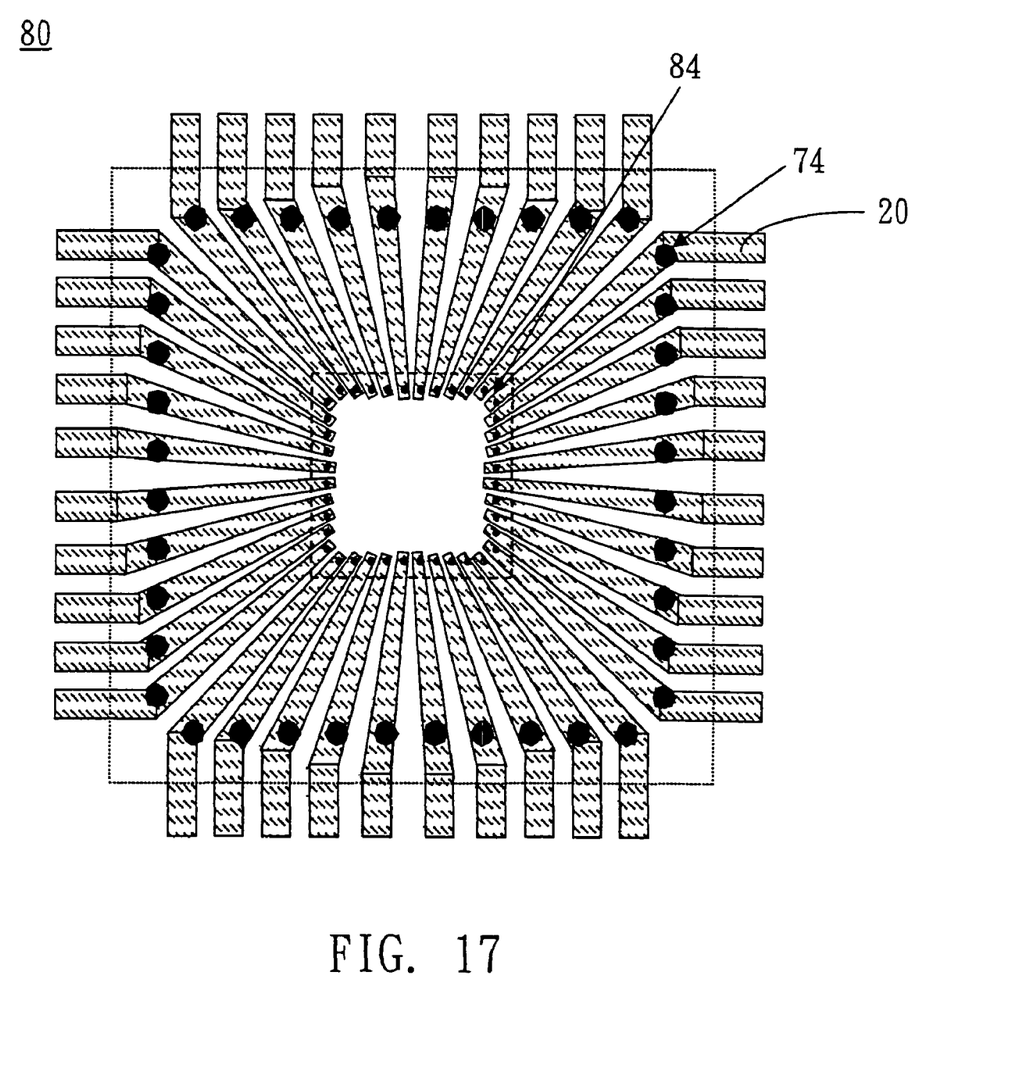

Referring to FIG. 16, a perspective of a lead frame according to a first embodiment of the invention is shown FIG. 16 is bottom view of FIG. 8, wherein the package trace layout unit 80 formed by a first conductive layer is embedded in the first insulating layer 21, and a plurality of fiducial marks 90 are used for positioning a lead frame when the chip is packaged. In the present embodiment of the invention, the shape of individual package trace layout unit 80 is indicated in FIG. 17. A package trace layout unit 80 comprises a plurality of electrically isolated package traces to form the pattern of a package trace layout unit and correspond to a to-be-packaged chip, wherein smaller chips are electrically connected via the conductive dots 84, and larger chips are electrically connected via the conductive dots 74. Thus, it can be used as the lead frame of different sized chips in the present embodiment of the invention. As indicated in FIG. 16 and FIG. 17, the package trace layout units 80 substantially have the same pattern, and the package trace layout units 80, isolated between each other, are arranged in a matrix and embedded in the first insulating layer 21.

Each package trace layout unit 80 preferably has a fan-in or fan-out pattern. The first conductive layer 20 and the second conductive layer 41 can have different pitches to achieve the function of fine pitch.

Second Embodiment

Figure 18:
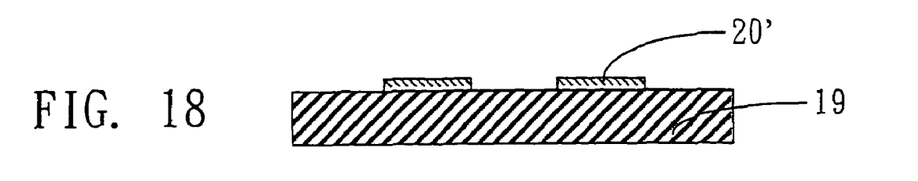
FIG. 18 to FIG. 25 are diagrams of manufacturing an independent semiconductor package according to a second embodiment of the invention.

Referring to FIG. 18 and onwards, a method of manufacturing a semiconductor package according to a second embodiment of the invention is shown. Firstly, a carrier 19 is provided, wherein the carrier 19 is made from copper in the present embodiment of the invention. Like FIG. 1 to FIG. 4 of the first embodiment, other manufacturing methods obtain the stage result as indicated in FIG. 18, a patterned first conductive layer 20' is formed on the carrier 19.

Figure 19:
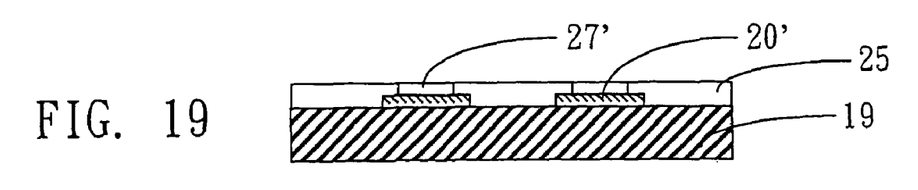
Figure 20:
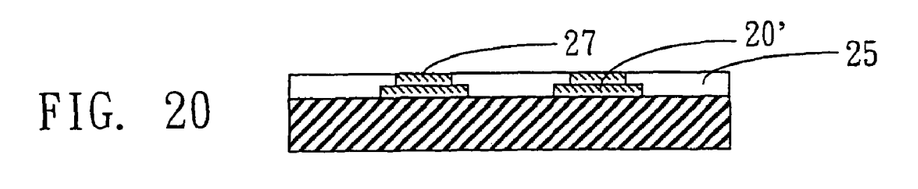

Referring to FIG. 19, a layer photo-resist layer 25 is coated on the first conductive layer 20', and a hole 27' is formed on the patterned photo-resist layer 25. Referring to FIG. 20, a second conductive layer 27 is formed in the hole 27'. In the present embodiment of the invention, the second conductive layer 27 is formed by way of electroplating and is substantially flat nor protruded from the surface of the first insulating layer 28.

Figure 21:
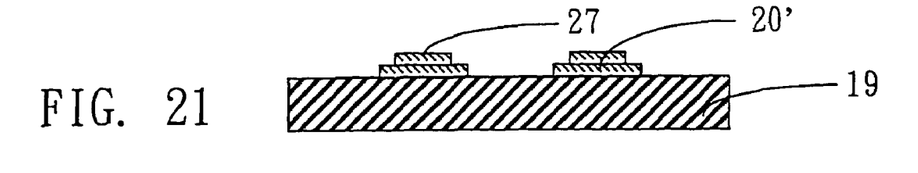
Figure 22:
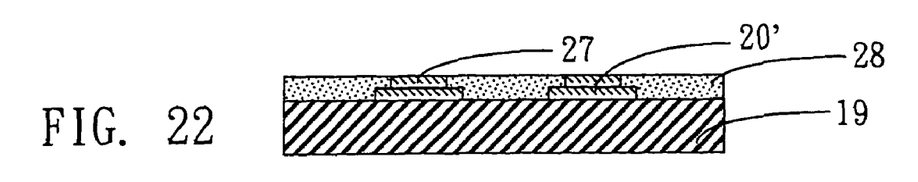

The photo-resist layer 25 is removed such that a patterned first conductive layer 20' and a second conductive layer 27 are obtained as indicated in FIG. 21. Referring to FIG. 22, a molding material is injected to form a first insulating layer 28, such that the patterned first conductive layer 20' and the second conductive layer 27 are embedded in the first insulating layer 28. In the present embodiment of the invention, the molding material used to form the first insulating layer 28 is epoxy resin, the elastic modulus of the molding material is greater than 1.0 GPa, but the CTE value of the elastic modulus is less than 10 ppm.

Figure 23:
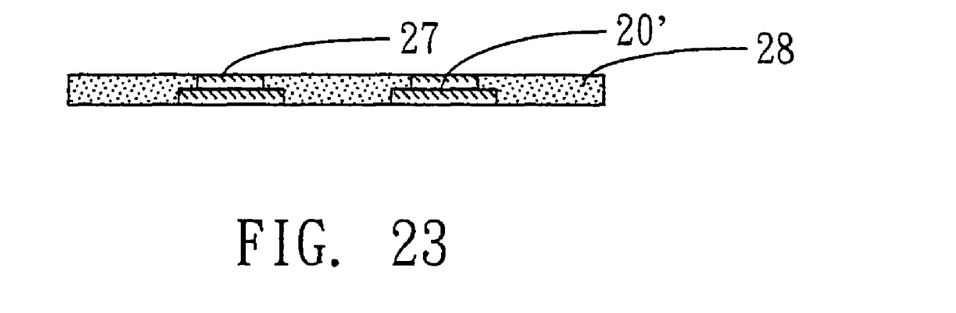
Figure 24:
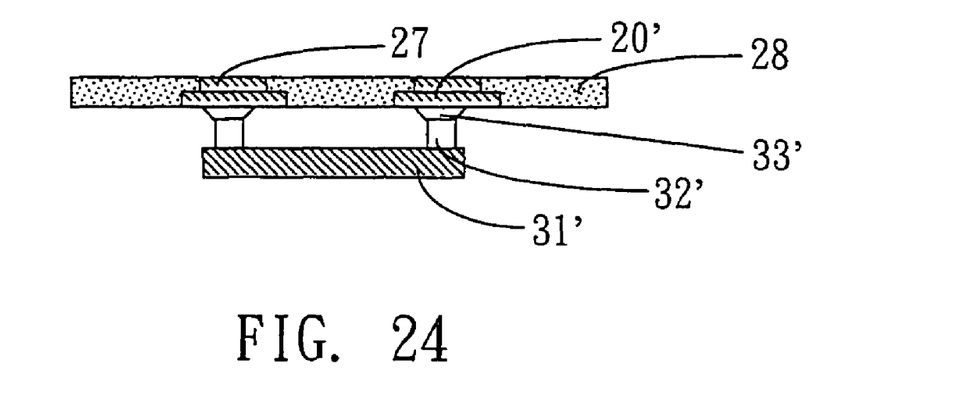

By way of etching, the carrier 19 is removed to obtain a semiconductor package before package as indicated in FIG. 23. The application of the unpackaged semiconductor package is indicated in FIG. 24, and the unpackaged semiconductor package can be connected to the chip 31' via the solder 33', the pillar bump 32'.

Besides, the second conductive layer 27 can be pre-treated to resolve the resin residue problem arising in a QFN package when the tape is removed.

Figure 25:
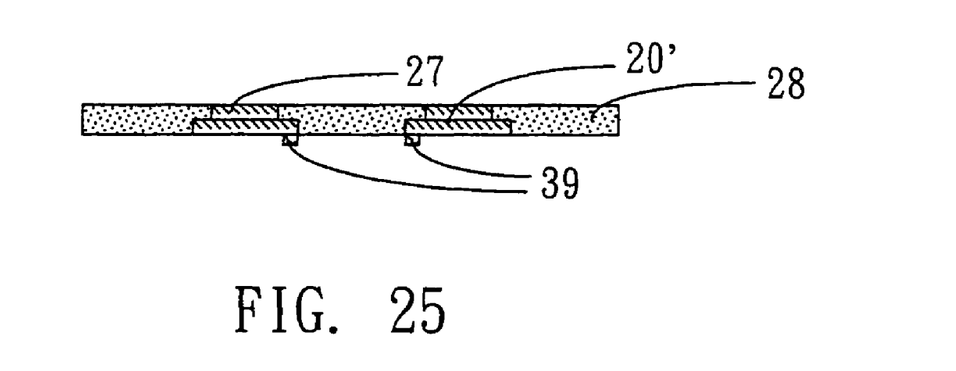

Referring to FIG. 25, a conductive protrusion 39 can be disposed on the first conductive layer 20' of the package trace layout. The conductive protrusion 39 can be made from silver, gold, other metals or conductive materials, and the part of the package trace layout directly atop of the conductive protrusion is the molding material of the first insulating layer 28. Thus, when the unpackaged semiconductor package is used in conventional wiring bonding, the trace can be connected to the conductive protrusion 39 such that the lead frame neighbors the chip package as close as possible and will not wobble when connected to the traces, hence increasing the efficiency of bonding the wire to the chip.

Third Embodiment

Figure 26:
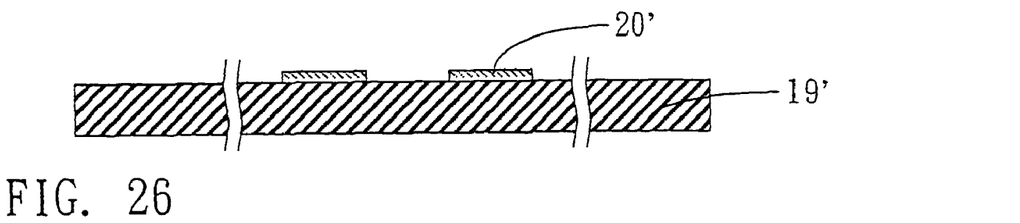
FIG. 26 to FIG. 36 are diagrams of manufacturing an independent semiconductor package according to a third embodiment of the invention.

Referring to FIG. 26 and onwards, a method of manufacturing a semiconductor package according to a third embodiment of the invention is shown. Firstly, a carrier 19' is provided, wherein the carrier 19' is made from copper in the present embodiment of the invention. Like FIG. 1 to FIG. 4 of the first embodiment, other manufacturing methods obtain the stage result as indicated in FIG. 26, a patterned first conductive layer 20' is formed on the carrier 19'.

Figure 27:
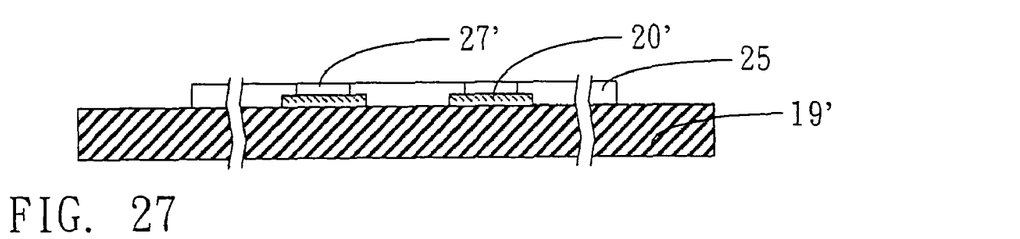
Figure 28:
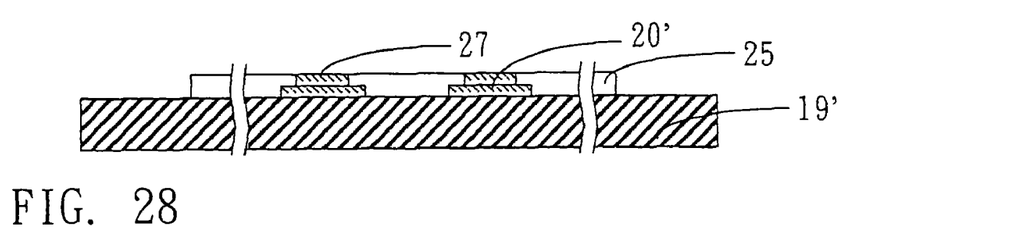

Referring to FIG. 27, a layer photo-resist layer 25 is coated on the first conductive layer 20', and a hole 27' is formed on the patterned photo-resist layer 25. Referring to FIG. 28, a second conductive layer 27 is formed in the hole 27'. In the present embodiment of the invention, the second conductive layer 27 is formed by way of electroplating and is substantially flat nor protruded from the surface of the the patterned photo-resist layer 25.

Figure 29:
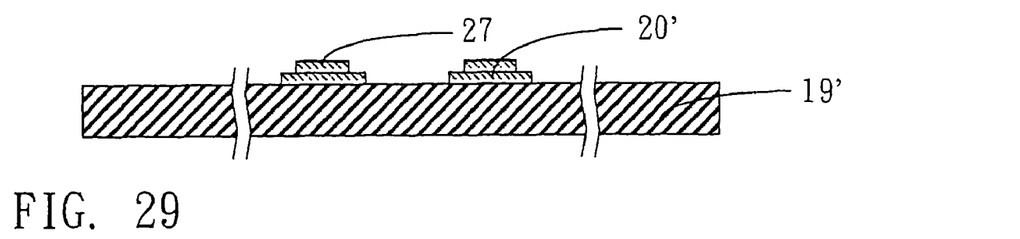
Figure 30:
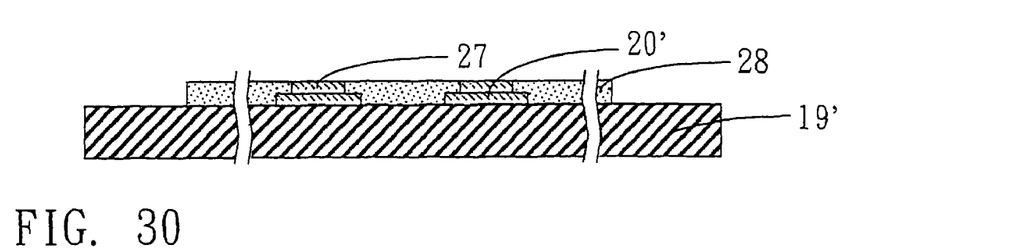

The photo-resist layer 25 is removed such that a patterned first conductive layer 20' and a second conductive layer 27 are obtained as indicated in FIG. 29. Referring to FIG. 30, a molding material is injected to form a first insulating layer 28, such that the patterned first conductive layer 20' and the second conductive layer 27 are embedded in the first insulating layer 28. In the present embodiment of the invention, the molding material used to form the first insulating layer 28 is epoxy resin, the elastic modulus of the molding material is greater than 1.0 GPa, but the CTE value of the elastic modulus is less than 10 ppm.

By way of etching, part of the carrier 19' is selectly removed to obtain a semiconductor package before package as indicated in FIGS. 31-35.

Figure 31:
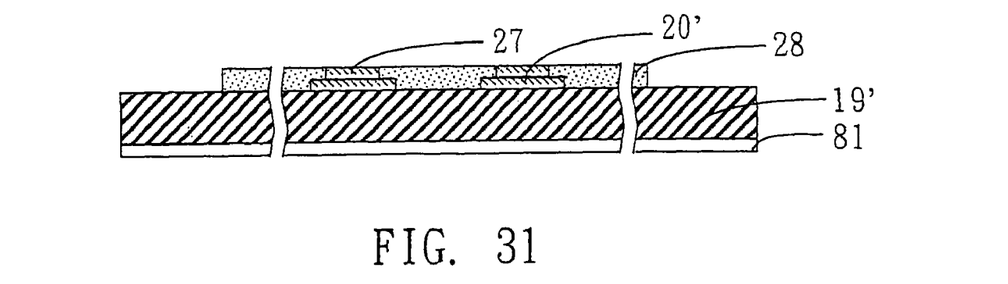
Figure 32:
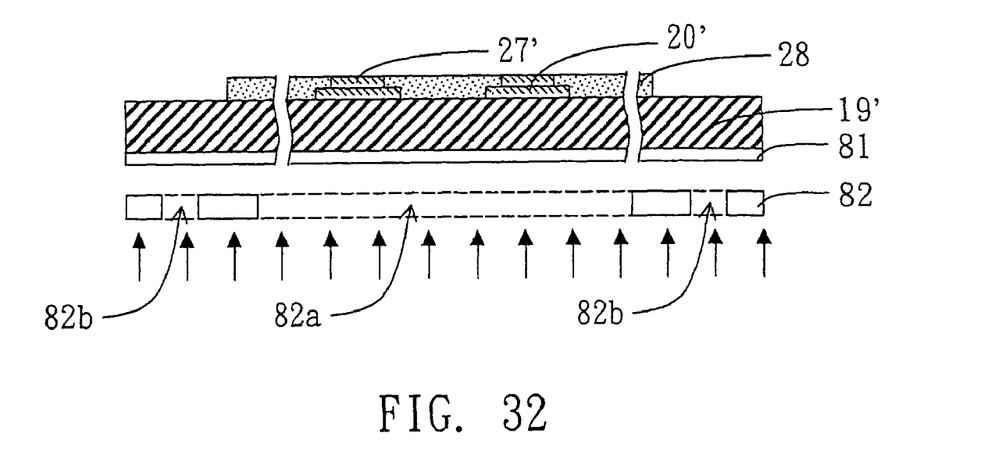
Figure 33:
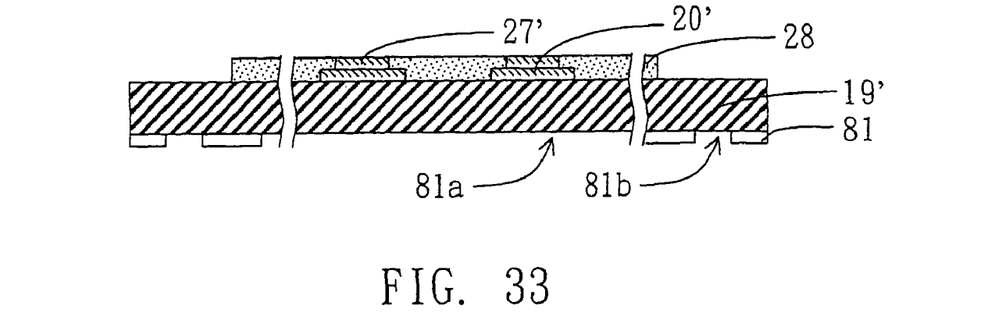

Referring to FIG. 31, a photo resist layer 81 is formed on the carrier 19'. Then the photo resist layer 81 is exposed via a mask 82 having at least a first opening 82a and at least a second opening 82b as shown in FIG. 32. And a patterned photo resist layer 81 having at least a first opening 81a and at least a second opening 81b is obtained as indicated in FIG. 33. Wherein the first opening 81a and the first opening 82a are corresponding with the inside area of the first insulating layer 28, and the second opening 81b and the second opening 82b are corresponding with the outside area of the first insulating layer 28.

Figure 34:
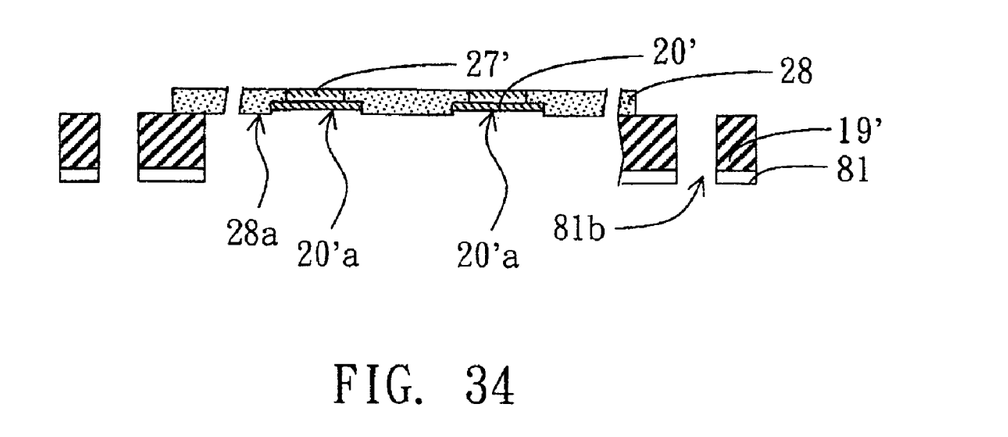
Figure 35:
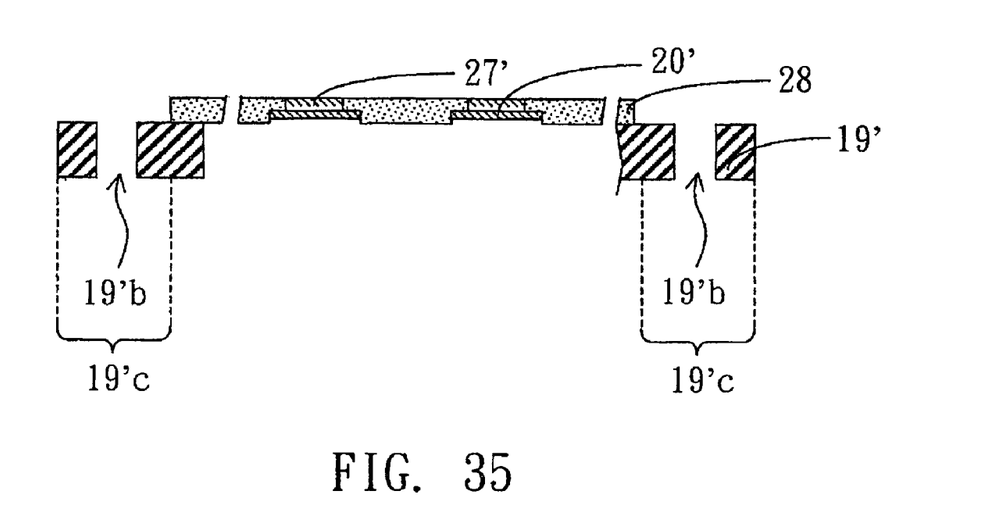

Afterwards, referring to FIG. 34, the carrier 19' is etched by taking the patterned photo resist layer 81 as a mask. Wherein the carrier 19' and part of the first conductive layer 20' are etched simultaneously so that the surface 20'a of the first conductive layer 20' and the surface 28a of the first insulating layer 28 are not located at the same plane. Then, the patterned photo resist layer 81 is removed so that an enforcement ring 19'c and at least a positioning hole 19'b are formed on the carrier 19' as indicated in FIG. 35.

Figure 36:
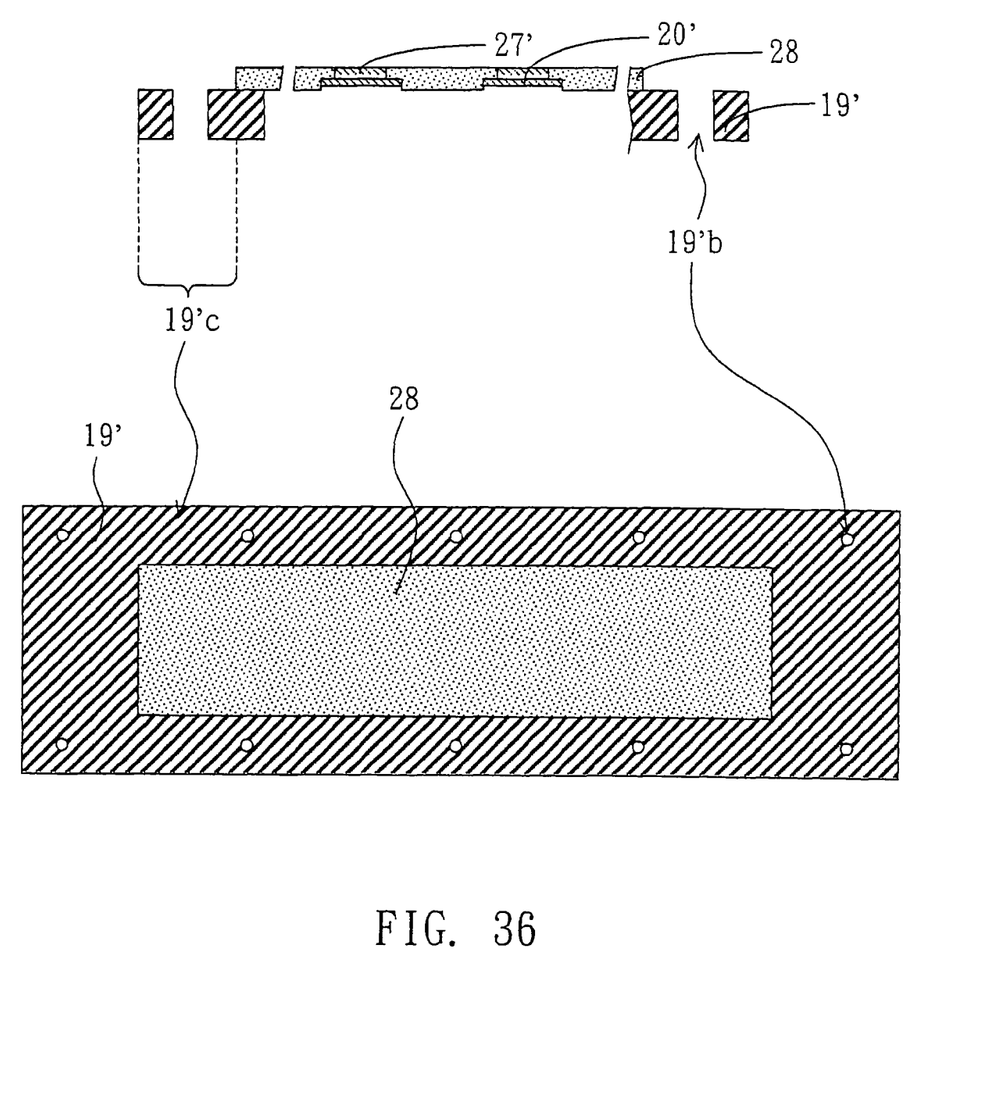

Please refer to FIG. 36. After part of the carrier 19' is selectly removed, the enforcement ring 19'c is formed on the peripheral area of the carrier 19' and the positioning hole 19'b are formed in the enforcement ring 19'c. The semiconductor package can be carried via the enforcement ring 19'c and the position hole 19'b without touching the first insulating layer 28 or the second conductive layer 27. Therefore, the scraping damage of the semiconductor package can be prevented.

The conductive layer 20 or 20' (the package trace) is formed during the manufacturing process without applying extra process such as micro-filming, exposure and etching on the conductive layer, so that the conductive layer is not restricted by the etching pitch and the reliability of the package trace will not be affected by undercutting. However, the package trace meets the requirement of miniaturization in the semiconductor element better.

The package trace layout unit has a fan-in or fan-out pattern to achieve the function of fine pitch.

Moreover, the hole 22 (the positioning unit) makes the positioning setting of connecting the solder ball to the package element more precisely, and avoids the overflowing of the solder when melted.

Besides, the mold 23, and hole 22 (the positioning unit) are formed by using the material of the first insulating layer 21 directly, such that the first insulating layer 21 and the positioning unit are formed by one filling of the molding material, largely simplifying the manufacturing process of the semiconductor package.

Moreover, according to FIG. 11, with the disposition of the package trace 20, the pitch between the solder balls can be larger than the pitch between the chip bumps 32. Therefore, the technology of the invention can be applied to a manufacturing process with a lower requirement of the pitch.

Furthermore, the first insulating layer 21 uses a molding material as a carrier for the package trace pattern, therefore the package trace patterns are not connected by metallic traces and are different form conventional lead frame which has traces for connecting the package trace patterns. The insulating layer between the traces of the lead frame is simply used for insulating purpose and can not be used as a carrier. As a result, in the embodiments of the invention does not have the connecting traces for connecting the lead frame patterns, and each package has an individual pattern, and is easier for cutting.

In a conventional chip, the package traces are connected via metallic traces, therefore the package traces must be divided first before the chip can be tested individually. In the above embodiments, as each package trace pattern is electrically isolated and does not have metallic traces for connection, the chip still can be tested even after the chip is connected to the package trace, largely saving time and cost for testing.

While the invention has been described by way of example and in terms of a preferred embodiment, it is to be understood that the invention is not limited thereto. On the contrary, it is intended to cover various modifications and similar arrangements and procedures, and the scope of the appended claims therefore should be accorded the broadest interpretation so as to encompass all such modifications and similar arrangements and procedures. For examples, the first insulating layer 21, is not necessarily limited to one layer. Any one who is skilled in the technology of the invention can use several materials to compose a compound insulating layer in several times of formation or use the same material to compose an insulating layer in several times of formation, and such modifications are still within the scope of protection of the invention which is defined in the appended claims.

What is claimed is:

1. A method of manufacturing a semiconductor package, comprising the following steps of:
   providing a carrier;
   forming a plurality of electrically isolated package trace layout units formed by a first patterned conductive layer having a first top surface and a first bottom surface, wherein each package trace layout unit is formed by a plurality of electrically isolated package traces;
   forming a second patterned conductive layer having a second top surface and a second bottom surface, the second bottom surface disposed on the first top surface;
   forming a first insulating layer formed by a molding material, wherein the first insulating layer has a third top surface and a third bottom surface, the first patterned conductive layer and the second patterned conductive layer are disposed inside the first insulating layer, the first bottom surface of the first patterned conductive layer and the third bottom surface of the first insulating layer are located at the same plane, the second top surface of the second patterned conductive layer and the third top surface of the first insulating layer are located at the same plane, the whole area of the first insulating layer is smaller than the whole area of the carrier, and the whole area of the first insulating layer is enclosed within the whole area of the carrier; and
   selectively removing part of the carrier to form at least an internal opening and at least a positioning opening, wherein the internal opening corresponds with an inside area of the first insulating layer, and the positioning opening corresponds with an outside area of the first insulating layer.

2. The manufacturing method of semiconductor package according to claim 1, wherein the step of selectively removing part of the carrier further comprises:
   forming a photo resist layer on the carrier;
   patterning the photo resist layer;
   etching the carrier by taking the patterned photo resist layer as a mask; and
   removing the patterned photo resist layer.

3. The manufacturing method of semiconductor package according to claim 2, wherein the step of etching the carrier further comprises:
   etching the carrier and part of the first patterned conductive layer simultaneously so that the surface of the etched first patterned conductive layer and the surface of the etched first insulating layer are not located at the same plane.

4. The manufacturing method of semiconductor package according to claim 2, wherein the patterned photo resist layer has at least a first opening and at least a second opening, the first opening is corresponding with the inside area of the first insulating layer, and the second opening is corresponding with the outside area of the first insulating layer.

* * * * *